(12) United States Patent
Rosik et al.

(10) Patent No.: US 7,548,128 B2
(45) Date of Patent: Jun. 16, 2009

(54) SYSTEMS AND METHODS WITH REDUCED REFERENCE SPURS USING A CRYSTAL OSCILLATOR FOR BROADBAND COMMUNICATIONS

(75) Inventors: Ray Rosik, San Diego, CA (US);
Weinan Gao, San Diego, CA (US);
Mats Lindstrom, San Diego, CA (US)

(73) Assignee: NXP B.V., Eindhoven (NL)

( * ) Notice: Subject to any disclaimer, the term of this patent is extended or adjusted under 35 U.S.C. 154(b) by 86 days.

(21) Appl. No.: 11/612,666

(22) Filed: Dec. 19, 2006

(65) Prior Publication Data
US 2008/0143452 A1  Jun. 19, 2008

(51) Int. Cl.
*H03B 5/32* (2006.01)
(52) U.S. Cl. ............... 331/116 R; 331/158; 331/183
(58) Field of Classification Search ........... 331/74, 331/77, 116 R, 116 FE, 158, 160, 182, 183
See application file for complete search history.

(56) References Cited

U.S. PATENT DOCUMENTS

| | | | |
|---|---|---|---|
| 6,025,757 A * | 2/2000 | Tsukagoshi et al. | 331/158 |
| 7,098,753 B1 * | 8/2006 | Dumitrescu et al. | 331/182 |
| 7,123,113 B1 * | 10/2006 | Brennan et al. | 331/158 |
| 7,292,114 B2 * | 11/2007 | Greenberg | 331/158 |
| 7,332,979 B2 * | 2/2008 | Connell et al. | 331/183 |
| 2006/0071729 A1 * | 4/2006 | Cetin et al. | 331/158 |

* cited by examiner

*Primary Examiner*—Robert Pascal
*Assistant Examiner*—Ryan J. Johnson

(57) ABSTRACT

Systems and methods are provided. In this regard, a representative system incorporates a crystal oscillator circuit and a digital automatic level control circuit. The digital automatic level control circuit is operative to: convert an oscillation amplitude of the crystal oscillator circuit to a proportional DC voltage; convert the DC voltage to a corresponding digital code representation; and adjust bias current and oscillator loop gain such that a desired oscillation amplitude is set.

13 Claims, 17 Drawing Sheets

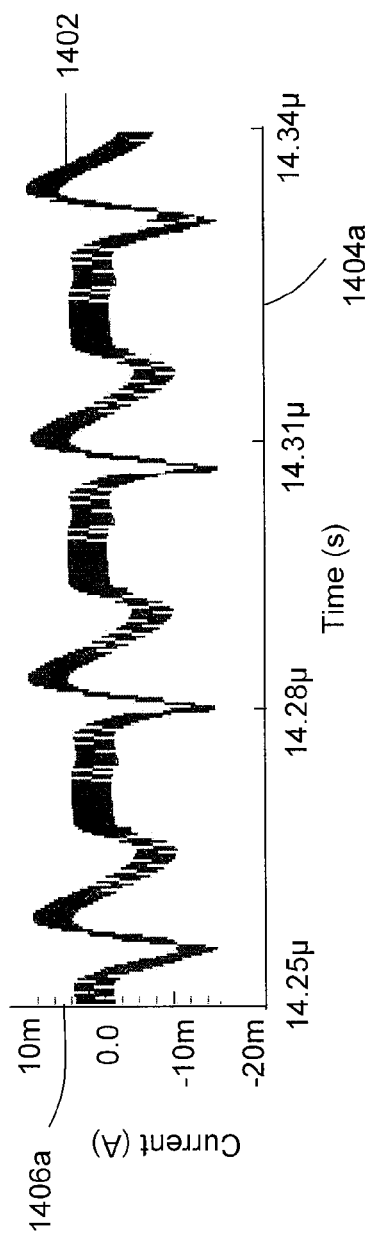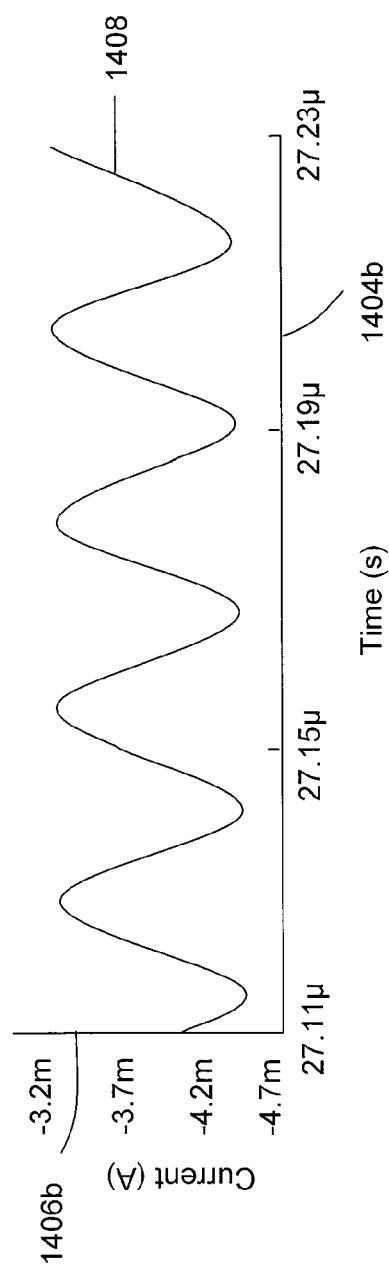

SYSTEMS AND METHODS WITH REDUCED REFERENCE SPURS USING A CRYSTAL OSCILLATOR FOR BROADBAND COMMUNICATIONS

TECHNICAL FIELD

The invention generally relates to crystal oscillator circuits and the devices in which such circuits operate or with which such circuits are associated.

DESCRIPTION OF THE RELATED ART

A crystal oscillator is an electronic circuit that uses the mechanical resonance of a physical crystal of piezoelectric material, along with an amplifier and feedback, to create an electrical signal at a very precise frequency. The loop gain of a crystal oscillator is the amount of amplification brought about in the electrical signal in the closed loop of the amplifier and feedback paths.

Crystal oscillators are used for providing very precise reference signals to phase locked-loops used in broadband communication chip sets. The crystal oscillator may be integrated onto the same substrate as one or more of the dies in the chip set, including the tuner and/or demodulator, thereby providing highly integrated broadband communication chip sets.

The design of crystal oscillators used in highly integrated broadband communication chip sets has a number of requirements. Firstly, crystal oscillators are designed to work for a variety of crystals at a wide range of crystal frequencies ranging from 10 MHz to 56 MHz. The crystal frequency is the resonant frequency of the crystal, which may be the fundamental frequency or the third overtone. To handle crystals of all types over all process, voltage and temperature conditions, the crystal oscillator should start up reliably with sufficient loop gain to compensate for drive-level dependency issues driving start up. The drive-level dependency (DLD) of a crystal is a large increase in crystal series resistance at startup which may prevent oscillation from starting. DLD varies considerably for different crystal manufacturers and is rarely characterized.

Secondly, the crystal oscillators should provide a signal output with high peak-to-peak amplitude and low-phase noise. This is to ensure that the oscillators have a negligible impact on the overall integrated phase noise of the phase-locked loop.

Thirdly, the design of the crystal oscillator should minimize the reference spurs generated on the chip at the crystal frequency and all higher frequency harmonics. Reference spurs are signal power at multiples of the crystal frequency that fall within the signal band of the receiver. Reference spurs are generated by the higher harmonic, non-linear content of the switching currents in the crystal oscillator. Reference spurs result in the deterioration of the performance of integrated receivers. For example, in a fully integrated silicon tuner, reference spurs limit the overall receiver sensitivity and may prevent compliance with many TV standards, including Digital Video Broadcasting-Terrestrial (DVB-T) and Advanced Television Systems Committee (ATSC).

An existing integrated crystal oscillator is the Pierce crystal oscillator. The Pierce crystal oscillator is a modified Colpitts oscillator using a crystal resonating in parallel mode. A specific implementation of the Pierce crystal oscillator uses a current-biased Common Metal Oxide semiconductor (CMOS) inverter as the amplifier.

The Pierce crystal oscillator has two perceived drawbacks when used for applications in broadband silicon tuner products. Firstly, such an oscillator does not possess an Automatic Level Control (ALC) feedback loop for controlling the amplitude of the reference signals. Therefore, the loop gain of the Pierce crystal oscillator typically is designed with a large margin to guarantee the start up of worst-case crystals under the worst-case Process-Voltage-Temperature (PVT) conditions. This design of the loop gain pushes the amplifier of the Pierce crystal oscillator deeper into compression for nominal crystals, generating much higher spurious harmonic content in the switching currents. Higher harmonic content in the switching currents creates higher reference spurs on the substrate. These reference spurs then fall within the signal band of the tuner and limit the overall sensitivity of the receiver.

Secondly, the Pierce crystal oscillator has a single-ended design, which tends to generate high switching currents and large transient currents over a portion of the oscillation cycle during the discharging of the crystal.

Another existing integrated crystal oscillator is the analog ALC crystal oscillator. The analog ALC crystal oscillator is similar to the Pierce crystal oscillator in structure, but includes an analog ALC circuit to control the excess loop gain of the oscillator. The analog ALC crystal oscillator overcomes several drawbacks of the Pierce crystal oscillator. The analog ALC circuit provides a constant swing in the signal output of the oscillator, as well as lower reference spurs, as compared to the Pierce crystal oscillator. The analog ALC circuit also guarantees the start up of the oscillator over a wide range of crystals and PVT conditions. The loop gain in the analog ALC crystal oscillator is limited to the value that is necessary for providing a given signal swing. Therefore, the amplifier in the analog ALC crystal oscillator is not pushed into compression for nominal crystals, as is the case with the Pierce crystal oscillator.

In spite of the advantages of the analog ALC crystal oscillator over the Pierce crystal oscillator, the analog ALC crystal oscillator also has two perceived drawbacks. Firstly, the analog ALC circuit has many noise sources such as transistors, resistors and additional current sources, which raise the phase noise of the analog ALC crystal oscillator, and consequently the integrated phase noise of the phase-locked loop. Secondly, the analog ALC crystal oscillator is based on a single-ended topology, which is similar to the Pierce crystal oscillator. While the analog ALC circuit reduces the magnitude of the switching currents produced during each oscillation cycle, the single-ended topology requires a fixed amount of charge to be supplied and removed from capacitances connected to the crystal.

SUMMARY

Systems and methods are provided. In this regard, an exemplary embodiment of such a system comprises a crystal oscillator circuit and a digital automatic level control circuit. The digital automatic level control circuit is operative to: convert an oscillation amplitude of the crystal oscillator circuit to a proportional DC voltage; convert the DC voltage to a corresponding digital code representation; and adjust bias current and oscillator loop gain such that a desired oscillation amplitude is set.

Another embodiment of such a system comprises a crystal oscillator circuit comprising: means for limiting an oscillation amplitude of the circuit to a programmable level; and means for providing increased gain at startup such that drive level dependency variation in a crystal of the circuit is compensated.

An embodiment of such a method comprises: converting an oscillation amplitude of the crystal oscillator circuit to a proportional DC voltage; converting the DC voltage to a corresponding digital code representation; and adjusting bias current and oscillator loop gain such that a desired oscillation amplitude is set.

BRIEF DESCRIPTION OF THE DRAWINGS

Exemplary embodiments of the invention will herein after be described in conjunction with the appended drawings, provided to illustrate and not to limit the invention, wherein like designations denote like elements, and in which:

FIGS. 16A and 16B are diagrams illustrating graphs for switching current in prior art oscillator circuits and in an embodiment of an oscillator circuit.

DETAILED DESCRIPTION

Exemplary embodiments involve crystal oscillator circuits that can be configured to provide reference signals in broadband chip sets. Such an oscillator circuit can include a differential amplifier, a digital automatic level control circuit, and a startup boost circuit. The differential amplifier provides differential output signals with reduced reference spurs. The DALC provides feedback control on the amplitude of the reference signals, while adding less phase noise, as compared to analog Automatic Level Control (ALC) circuits. The start up boost circuit compensates for the drive-level dependencies of the crystal. The reference signals provided by the oscillator circuit have reduced harmonic content and phase noise, as compared to oscillator circuits in the prior art.

The individual circuit blocks may be used independently or in any combination to reduce the reference spurs when integrated on the same die as a receiver.

Figure 1:
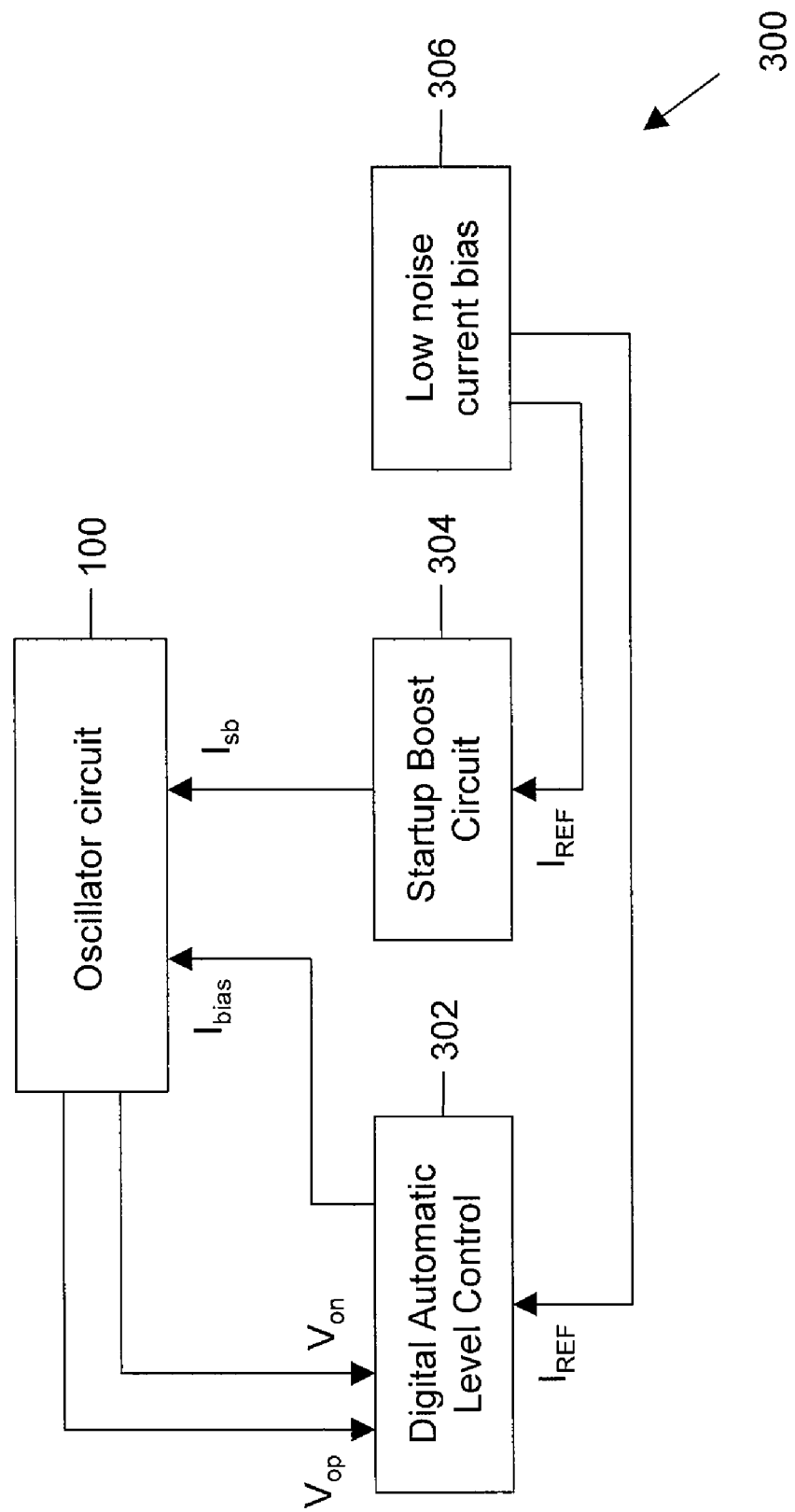
FIG. 1 is a block diagram of a system combining the oscillator circuit with digital automatic level control, startup boost, and low noise bias, in accordance with an embodiment of the invention.

FIG. 1 is a block diagram of an embodiment of a system with reduced reference spurs. In this regard, a "system" can refer to a single component, e.g., a die, or a multiple components, e.g., a chip set.

As shown in FIG. 1, system 300 combines an oscillator circuit 100 with a DALC 302, a start up boost circuit 304, and a low-noise current bias 306. Oscillator circuit 100 provides differential output signals $V_{op}$ and $V_{on}$ to DALC 302. DALC 302 provides bias current $I_{bias}$ to oscillator circuit 100. The functionality of DALC 302, to generate bias current $I_{bias}$, is explained in detail in conjunction with FIG. 4. Start up boost circuit 304 provides start up boost current $I_{sb}$ to oscillator circuit 100. The functionality of start up boost circuit 304 to provide start up boost current $I_{sb}$ is explained in detail in conjunction with FIG. 8. Low-noise current bias 306 provides a reference current $I_{REF}$ to DALC 302 and start up boost circuit 304. The reference current $I_{REF}$ provided by low-noise current bias 306 is used along with the oscillator circuit to generate reference signals with low phase noise.

Figure 2:
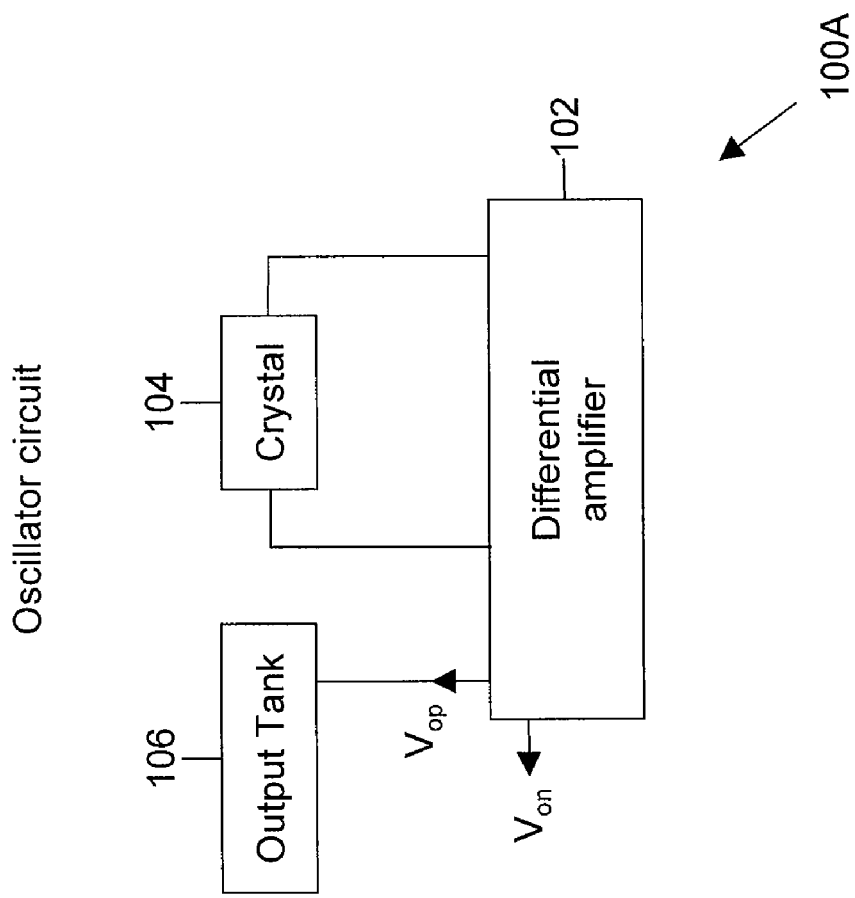
FIG. 2 is a block diagram of an oscillator circuit providing reference signals in broadband communication chip sets, in accordance with an embodiment of the invention.

FIG. 2 is a block diagram of an embodiment of an oscillator circuit, such as oscillator circuit 100, that can be used to provide reference signals in broadband communication chip sets. In this regard, oscillator circuit 100A includes a differential amplifier 102, a crystal 104 and an output tank 106.

Differential amplifier 102 amplifies input signals to provide differential output signals $V_{op}$ and $V_{on}$. Differential output signal $V_{op}$ is fed into output tank 106. Output tank 106 acts as a filter with low quality factor to filter differential output signal $V_{op}$ to be within a desired frequency range. Crystal 104 is connected in series mode with differential amplifier 102. Crystal 104 acts as a high quality factor filter to filter differential output signal $V_{op}$ to a desired frequency. Therefore, the reference signals provided by oscillator circuit 100A are pure signals at the desired frequency. The loop gain of oscillator circuit 100A is a function of the amplification provided by differential amplifier 102 and the feedback provided by crystal 104 and output tank 106. The working of oscillator circuit 100A is explained in conjunction with FIG. 2.

Figure 3:
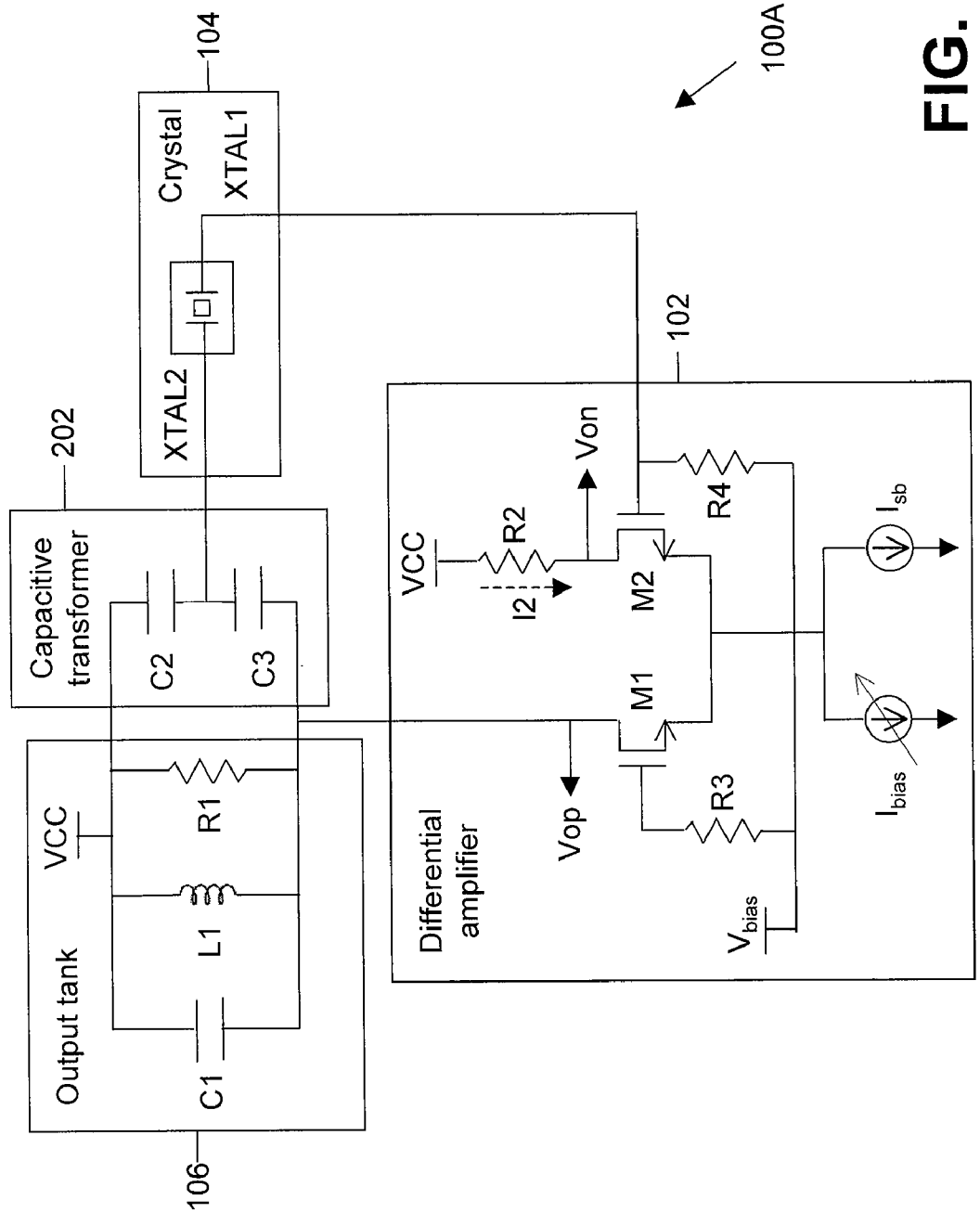
FIG. 3 is a circuit diagram of the oscillator circuit, in accordance with an embodiment of the invention.

FIG. 3 is a circuit diagram of oscillator circuit 100A of FIG. 2, which includes differential amplifier 102, crystal 104 and output tank 106. As shown in FIG. 3, the circuit also includes a capacitance transformer 202 connected to output tank 106 and crystal 104.

Differential amplifier 102 includes two transistors M1 and M2 to perform the amplification of signals. In some embodiments, the transistors M1 and M2 may be N-type Metal Oxide Semiconductor Field-Effect Transistors (NMOSFETS). The ⊖ transistors M1 and M2 are hereinafter referred to as NMOSFETS M1 and M2 without any intention to limit other embodiments to this particular configuration.

NMOSFETS M1 and M2 are arranged in a differential topology with the source terminals of NMOSFETS M1 and M2 being connected to each other. A bias voltage $V_{bias}$ is applied to the gate terminals of NMOSFETS M1 and M2. The resistances R3 and R4 isolate the low impedance of the bias voltage from the oscillator feedback loop. R4 also serves as a voltage divider with the series resistance of the crystal to increase the oscillator loop gain.

A bias current $I_{bias}$ is applied to the source terminals of NMOSFETS M1 and M2 during the steady-state operation of oscillator circuit 100A. Bias current $I_{bias}$ controls the amplification provided by NMOSFETS M1 and M2, and hence controls the loop gain of oscillator circuit. The generation of bias current $I_{bias}$ is explained in conjunction with FIG. 4. A start up boost current $I_{sb}$ is applied to the source terminals of NMOSFETS M1 and M2 during the start up period of oscillator circuit. Start up boost current $I_{sb}$ increases oscillator loop gain at startup to overcome drive-level dependencies in a wide range of crystals. Generation of the start up boost current $I_{sb}$ is explained in conjunction with FIG. 8.

The drain of NMOSFET M2 is connected to a voltage source VCC and a resistance R2. NMOSFET M2 is connected as a common source device as part of the differential pair. Noise voltage at the gate of M2 is amplified and converted into a current I2. Current I2 flows through resistance R2, thereby generating the inverted crystal oscillator output $V_{on}$. Current I2 then flows through NMOSFET M2 from the drain to the source. Current I2 then flows into NMOSFET M1 through the source terminal. NMOSFET M1 is operated in a common gate configuration as the gate of NMOSFET M1 is connected neither to the input path nor to the output path. NMOSFET M1 generates the positive differential output $V_{op}$ at the drain terminal. The positive differential output $V_{op}$ is passed onto output tank 106.

Output tank 106 includes a capacitance C1, an inductance L1, and a resistance R1. Output tank 106, in this embodiment, is external to the broadband communication chip set. Output tank 106 acts as an RLC filter with a low quality factor. Therefore, output tank 106 filters a broad range of signals centered around the desired resonant frequency of crystal 104. The low quality factor of output tank 106 enables greater tolerance to component variations, which may offset the centering of signals filtered from the desired resonant frequency. Output tank 106 thereby prevents oscillation at frequencies other than the desired resonant frequency of crystal 104. In some embodiments, the values of capacitance C1, inductance L1 and resistance R1 may be adjusted according to the desired resonant frequency of crystal 104, since output tank 106 may be external to the broadband communication chip set.

The signals filtered by output tank 106 are passed to capacitive transformer 202, which includes two capacitances, C2 and C3. Capacitive transformer 202 AC-couples the signal around oscillator circuit 100A and blocks the Direct Current (DC) bias across crystal 104. Capacitive transformer 202 also reduces the amplitude of the signals input from output tank 106, to decrease the loop gain of the feedback path provided by output tank 106 and crystal 104.

The signals from capacitive transformer 202 are passed on to crystal 104. Crystal 104 includes an input path XTAL1 and an output path XTAL2. Crystal 104 acts as a low-noise, high quality factor filter to generate output signals at the desired resonant frequency. The output signals from crystal 104 have very low harmonic, spurious content, as compared to output signals from prior art crystal oscillator circuits. In some embodiments, crystal 104 may be operated at the fundamental series resonant frequency. In other embodiments, crystal 104 may be operated at the third overtone series resonant frequency, for example.

Crystal 104 is connected in series mode with differential amplifier 102. Therefore, the charging and discharging of XTAL1 and XTAL2 occurs in phase. As a consequence, the output signals from crystal 104 have zero phase shift. Further, the output signals produced by crystal 104 are pure sinusoidal current signals. Therefore, the reference signals generated by oscillator circuit 100 are low-noise, pure sinusoidal signals with very little harmonic current, as compared to the reference signals generated by prior art crystal oscillator circuits.

Figure 4:
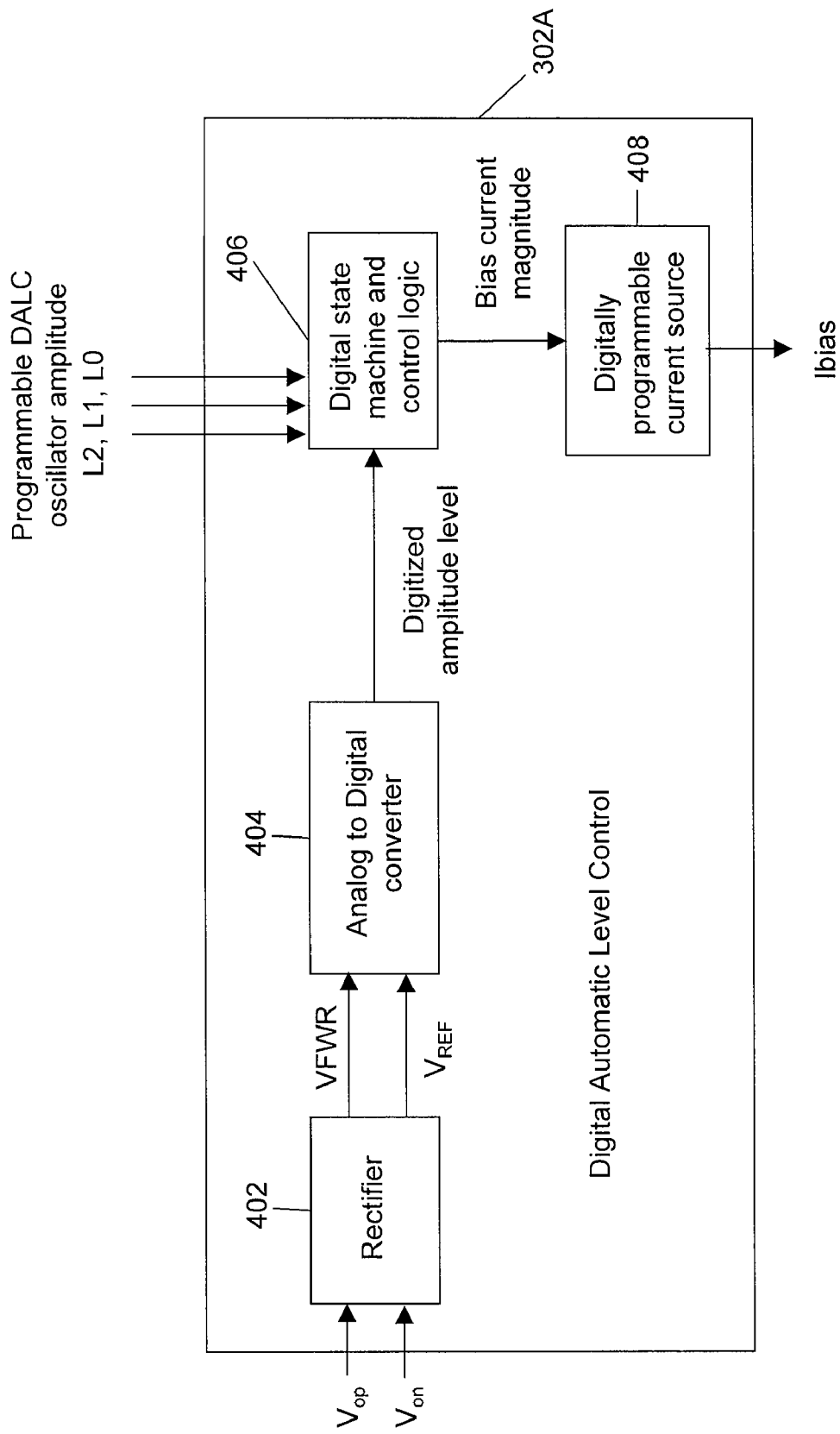
FIG. 4 is a block diagram of a digital automatic-level control, in accordance with an embodiment of the invention.

FIG. 4 is a block diagram of an embodiment of a DALC, such as DALC 302 of FIG. 1. In particular, DALC 302A includes a rectifier 402, an Analog-to-Digital Converter (ADC) 404, a digital state machine and control logic 406, and a digitally programmable current source 408. The function of DALC 302 is to adjust the amplitude level of the reference signals to correspond to a desired amplitude. DALC 302A provides bias current $I_{bias}$ corresponding to the amplitude level of differential output signals, $V_{op}$ and $V_{on}$. If the amplitude level of differential output signals $V_{op}$ and $V_{on}$ is greater than the desired amplitude level of the reference signals, then bias current $I_{bias}$, provided by DALC 302, is low, in order to reduce the amplitude of differential output signals $V_{op}$ and $V_{on}$. If the amplitude level of differential output signals $V_{op}$ and $V_{on}$ is less than the desired amplitude level of the reference signals, then bias current $I_{bias}$, provided by DALC 302A, is high, in order to increase the amplitude of differential output signals $V_{op}$ and $V_{on}$.

Rectifier 402 receives the differential output signals $V_{op}$ and $V_{on}$ as inputs from an oscillator circuit. Rectifier 402 then generates two output voltages, i.e., a full-wave rectified voltage VFWR and a reference voltage $V_{REF}$. The generation of the two output voltages by rectifier 402 is explained in detail in conjunction with FIG. 5.

Full-wave rectified voltage VFWR and reference voltage $V_{REF}$ are passed on to ADC 404. ADC 404 generates a digitized amplitude level corresponding to full-wave rectified voltage VFWR, with reference to reference voltage $V_{REF}$. The generation of the digitized amplitude level by ADC 404 is explained in detail in conjunction with FIG. 6. The digitized amplitude level generated by ADC 404 is passed on to digital state machine and control logic 406. Digital state machine and control logic 406 generates a bias current magnitude corresponding to the digitized amplitude level. The bias current magnitude is passed on to digitally programmable current source 408, which outputs bias current $I_{bias}$ corresponding to the bias current magnitude. The generation of bias current $I_{bias}$ by digitally programmable current source 408 is explained in detail in conjunction with FIG. 7.

Figure 5:
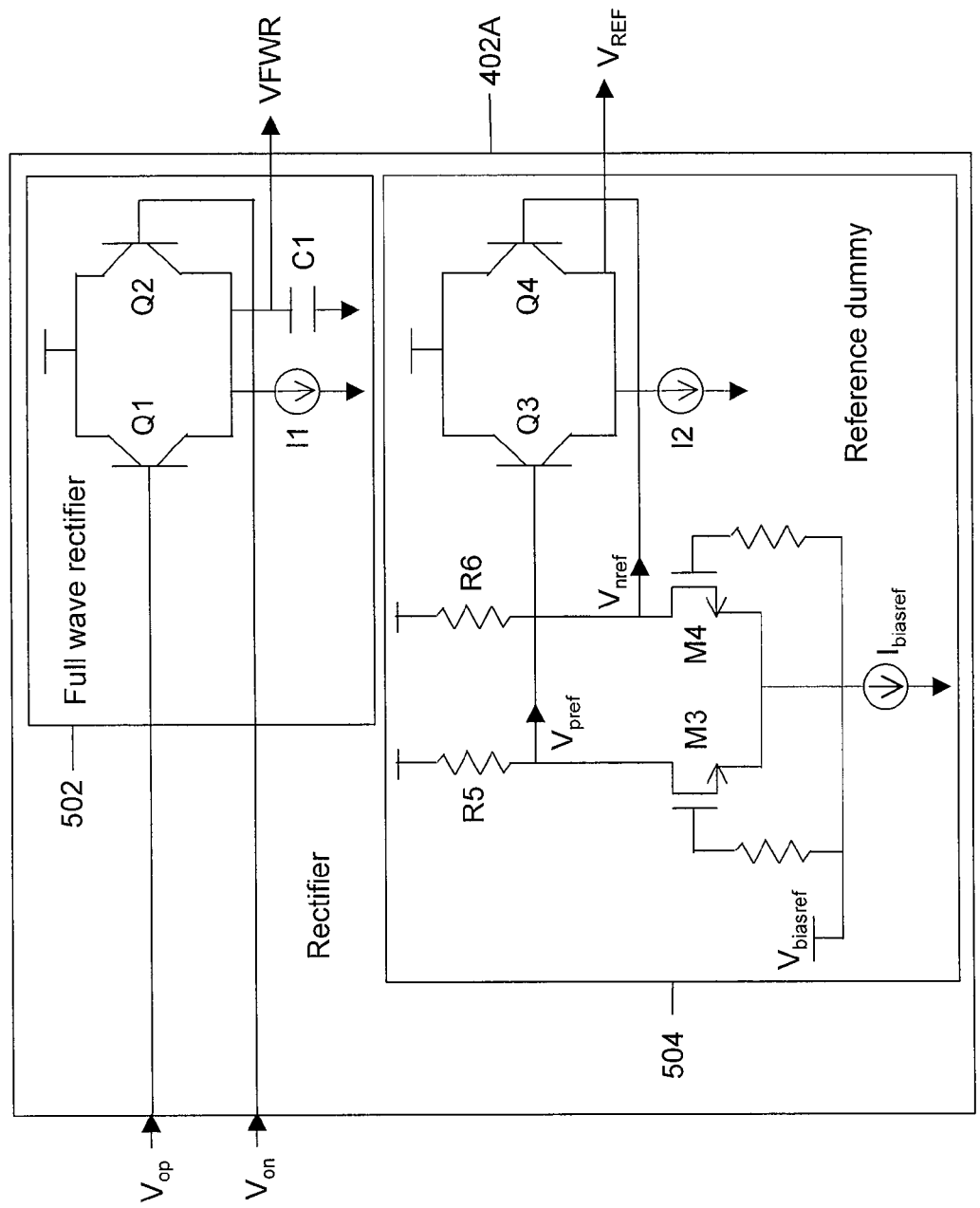
FIG. 5 is a circuit diagram of a rectifier circuit, in accordance with an embodiment of the invention.

FIG. 5 is a circuit diagram of an embodiment of a rectifier, such as can be used in the embodiment of FIG. 4. In this regard, rectifier 402A includes a full-wave rectifier 502 and a reference dummy 504. Full-wave rectifier 502 receives differential output signals $V_{op}$ and $V_{on}$ as inputs from an oscillator circuit. Full wave rectifier 502 outputs full-wave rectified voltage VFWR. Reference dummy 504 receives a zero input signal and outputs reference voltage $V_{REF}$.

Full-wave rectifier 502 includes a pair of transistors Q1 and Q2, a current source I1, and a capacitance C1. The pair of transistors Q1 and Q2 rectify differential output signals $V_{op}$ and $V_{on}$ into a DC full wave-rectified voltage VFWR. Current source I1 biases the pair of transistors Q1 and Q2. Capacitance C1 smoothes the full wave-rectified voltage VFWR.

Reference dummy 504 produces reference voltage $V_{REF}$ corresponding to zero input signal for comparison with the full wave rectified voltage VFWR. The voltage $V_{REF}$ establishes the minimum voltage of the full scale range of the ADC. In this way, the ADC full scale range can be matched to the signal range of the rectifier without wasting any dynamic range of the ADC or requiring additional bits of resolution. NMOSFETS M3 and M4 act as a differential amplifier that is similar to differential amplifier 102 (FIG. 2) used to match the DC bias voltages at $V_{pref}$ and $V_{nref}$. Bias voltage $V_{biasref}$ and bias current $I_{biasref}$ are applied to the NMOSFETS M3 and M4. Differential output signals $V_{pref}$ and $V_{nref}$ are generated by NMOSFETS M3 and M4. The differential output signals $V_{pref}$ and $V_{nref}$ are passed on to a rectifier that is similar to full-wave rectifier 502. The pair of transistors Q3 and Q4 level shift the DC voltages $V_{pref}$ and $V_{nref}$ down into DC reference voltage $V_{REF}$. Current source I2 biases the pair of transistors Q3 and Q4. Therefore, the DC voltages $V_{REF}$ and VFWR match in the case of zero input signal when there is no oscillation. As oscillation builds up, the VFWR voltage increases creating a DC voltage proportional to the oscillation signal amplitude.

Figure 6:
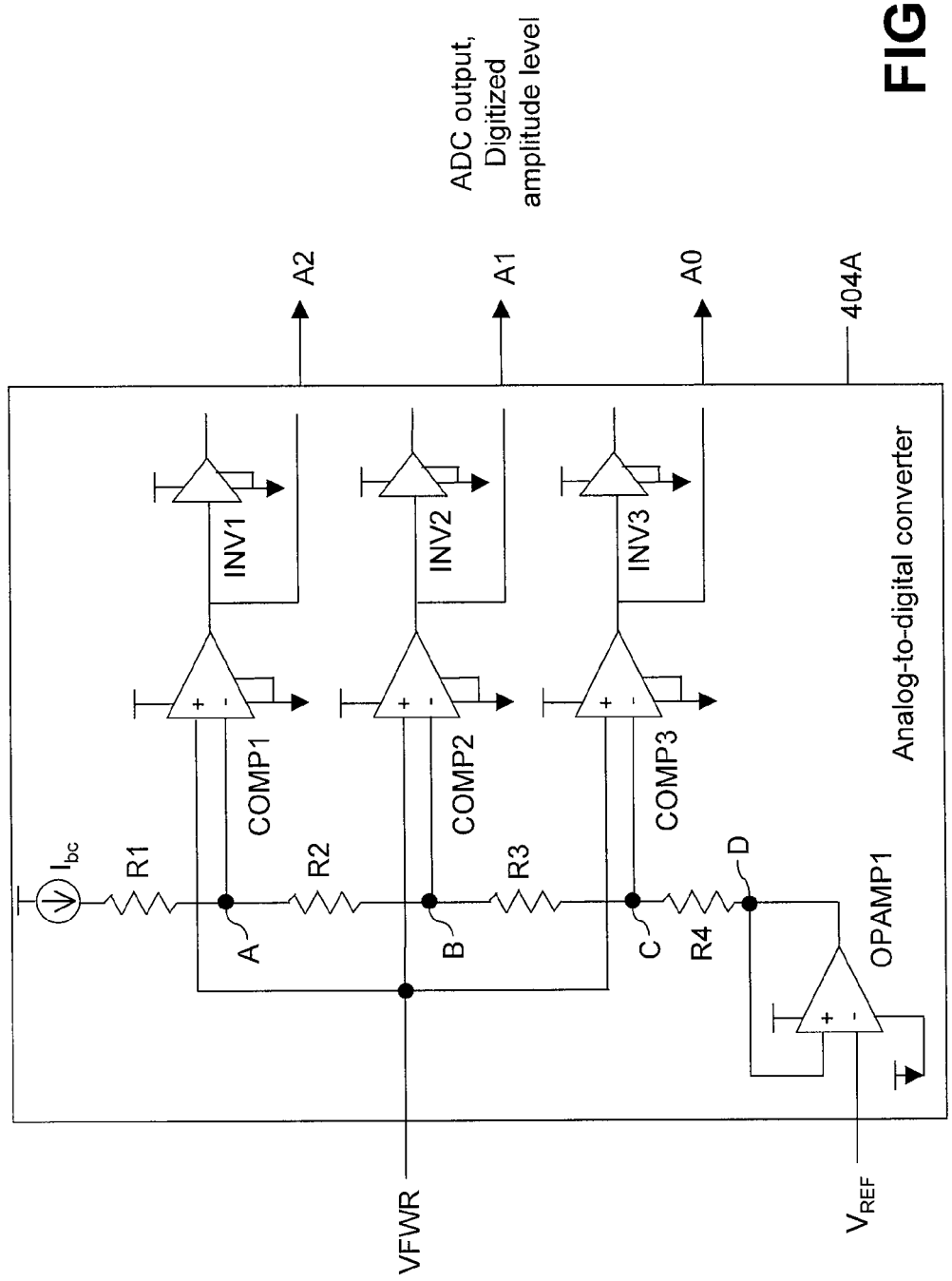
FIG. 6 is a circuit diagram of an analog-to-digital converter, in accordance with an embodiment of the invention.

The voltages VFWR and $V_{REF}$ are passed on to ADC 404. FIG. 6 is a circuit diagram of an embodiment of an ADC that can be used in the embodiment of FIG. 4. In this regard, ADC 404A includes an Operational Amplifier OPAMP1, three comparators COMP1, COMP2 and COMP3, four resistances R1, R2, R3 and R4, and three inverters INV1, INV2 and INV3.

Operational Amplifier OPAMP1 buffers the reference voltage $V_{REF}$ to define the low end of the full-scale range of ADC 404A. The three comparators COMP1, COMP2 and COMP3 compare the full-wave rectified voltage VFWR with several predefined voltage settings. These predefined voltage settings are generated by the four resistances R1, R2, R3 and R4 and reference voltage $V_{REF}$. In some embodiments, the number comparators and resistances may be greater than three, depending on the number of predefined voltage settings required for comparison. To increase the granularity of the analog-to-digital conversion, the number of comparators and resistances may be increased.

A bias current $I_{bc}$ is provided to the resistances R1, R2, R3 and R4. The bias current $I_{bc}$ establishes certain predefined voltages at points A, B and C. The voltages at points A, B and C are compared with the full-wave rectified voltage VFWR. Depending on the value of voltage VFWR, one or more of the comparators COMP1, COMP2 or COMP3 outputs a positive voltage. For example, take the values of voltages at the points A, B and C to be three, two and one volts, respectively. Let $V_{REF}$ be equal to zero volts. If the value of VFWR is 1.5 volts, then COMP3 will output a positive voltage since the voltage VFWR is greater than the voltage at point C; COMP2 will output a zero voltage since the voltage VFWR is less than the voltage at point B; COMP1 will output a zero voltage since the voltage VFWR is less than the voltage at point A. Inverters INV1, INV2 and INV3 invert the voltage output of comparators COMP1, COMP2 and COMP3. Therefore, INV1 outputs the value '1' on receiving zero voltage; INV2 outputs the value '1' on receiving zero voltage, and INV3 outputs the value '0' on receiving a positive voltage. The digitized amplitude level corresponding to the value of VFWR, of 1.5 volts, is the digital form of the voltages from the comparators, which is '001'. Similarly, if the value of VFWR is 2.5 volts, then the digital amplitude level is '011'. Further, if the value of VFWR is 3.5 volts, then the digitized amplitude level is '111'.

Figure 7:
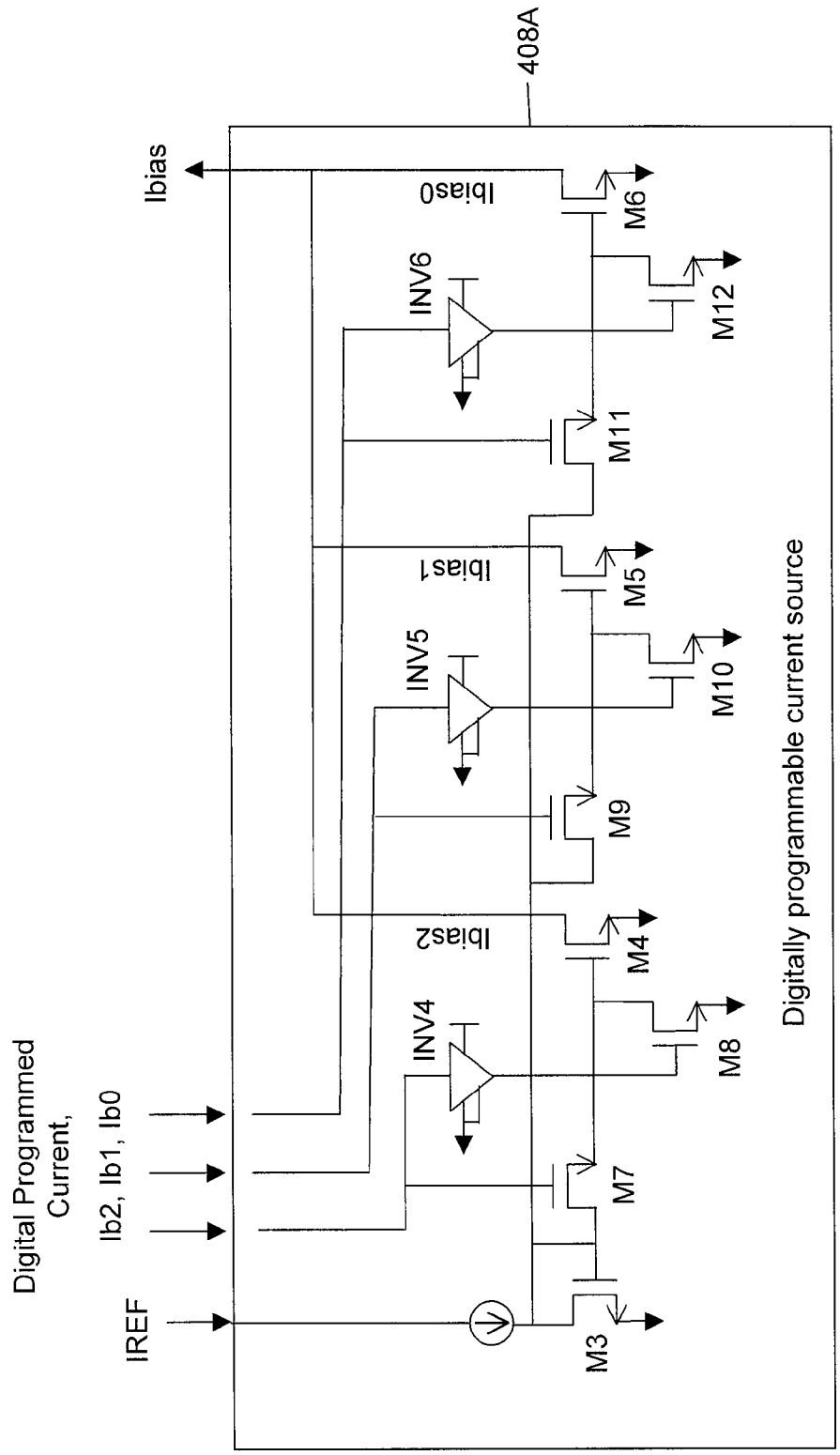
FIG. 7 is a circuit diagram of a digitally programmable current source, in accordance with an embodiment of the invention.

The bias current magnitude is transferred to digitally programmable current source 408. FIG. 7 is a circuit diagram of an embodiment of a digitally programmable current source that can be used in the embodiment of FIG. 4, for example. In this regard, digitally programmable current source 408A receives reference current $I_{REF}$ as input from low-noise current bias 306. Digitally programmable current source 408A includes NMOSFETS M3, M4, M5, M6, M7, M8, M9, M10, M11, M12, and inverters INV4, INV5 and INV6. NMOSFETS M7, M9 and M11 act as switches to connect the gates of M3, M4, M5, and M11 as current mirrors and output bias current $I_{bias}$ corresponding to the digitally programmed current. NMOSFETS M3, M4, M5, and M6 act as current mirrors to scale the reference current $I_{REF}$ corresponding to the digital programmed current and generate bias current $I_{bias}$. M8, M10, and M12 are switches to pull the gates of M4, M5, and M6 low to shut off the respective current sources.

For example, if the digital programmed bias current is '001', INV6 outputs a '0' pulling the gate on M12 low shutting this device off and releasing the gate of M6. M11 is turned on connecting the gate of M6 to M3 as a current mirror to turn on Ibias0. The gates on M7 and M9 are both low, disconnecting them from the current mirror M3. The outputs of INV4 and INV5 are both high turning on M8 and M1. M8 and M1 then pull the gates of M4 and M5 low to shutoff bias currents Ibias2 and Ibias1.

The bias current output by digitally programmable current source 408A is transferred to a differential amplifier, such as amplifier 102 of FIG. 2. With the change in bias current, the amplitudes of differential outputs $V_{op}$ and $V_{on}$ of the differential amplifier also change. If the amplitudes of differential outputs $V_{op}$ and $V_{on}$ are greater than the required amplitude of the reference signals, the bias current is decreased, to reduce the amplitudes of differential outputs $V_{op}$ and $V_{on}$. Similarly, if the amplitudes of differential outputs $V_{op}$ and $V_{on}$ are less than the required amplitude of the reference signals, the bias current would be increased, to increase the amplitudes of differential outputs $V_{op}$ and $V_{on}$. Therefore, the DALC helps to obtain the required amplitude of reference signals through a feedback mechanism.

The bias current output by the DALC has lower noise, as compared to analog ALC circuits in the prior art. The noise contribution of the DALC is limited only by the low noise bias current reference and the current mirrors M3, M4, M5, and M6 in the digitally programmable current source of FIG. 7. The switches that adjust the magnitude of the bias current, M7, M9, and M11, do not carry any current and therefore do not generate any additional noise. Further, the DALC is inherently stable and is compatible with different types of crystals.

The digitized amplitude level is transferred to digital state machine and control logic (e.g. 406 of FIG. 4). The digital state machine and control logic generates a bias current magnitude corresponding to the digitized amplitude level. The bias current magnitude is generated by comparing the digitized amplitude level with the desired amplitude level of the reference signals. In some embodiments, the digital state machine and control logic may include any logic circuitry to generate the bias current magnitude in inverse proportion to the difference between the digitized amplitude level and the desired amplitude level.

Figure 8:
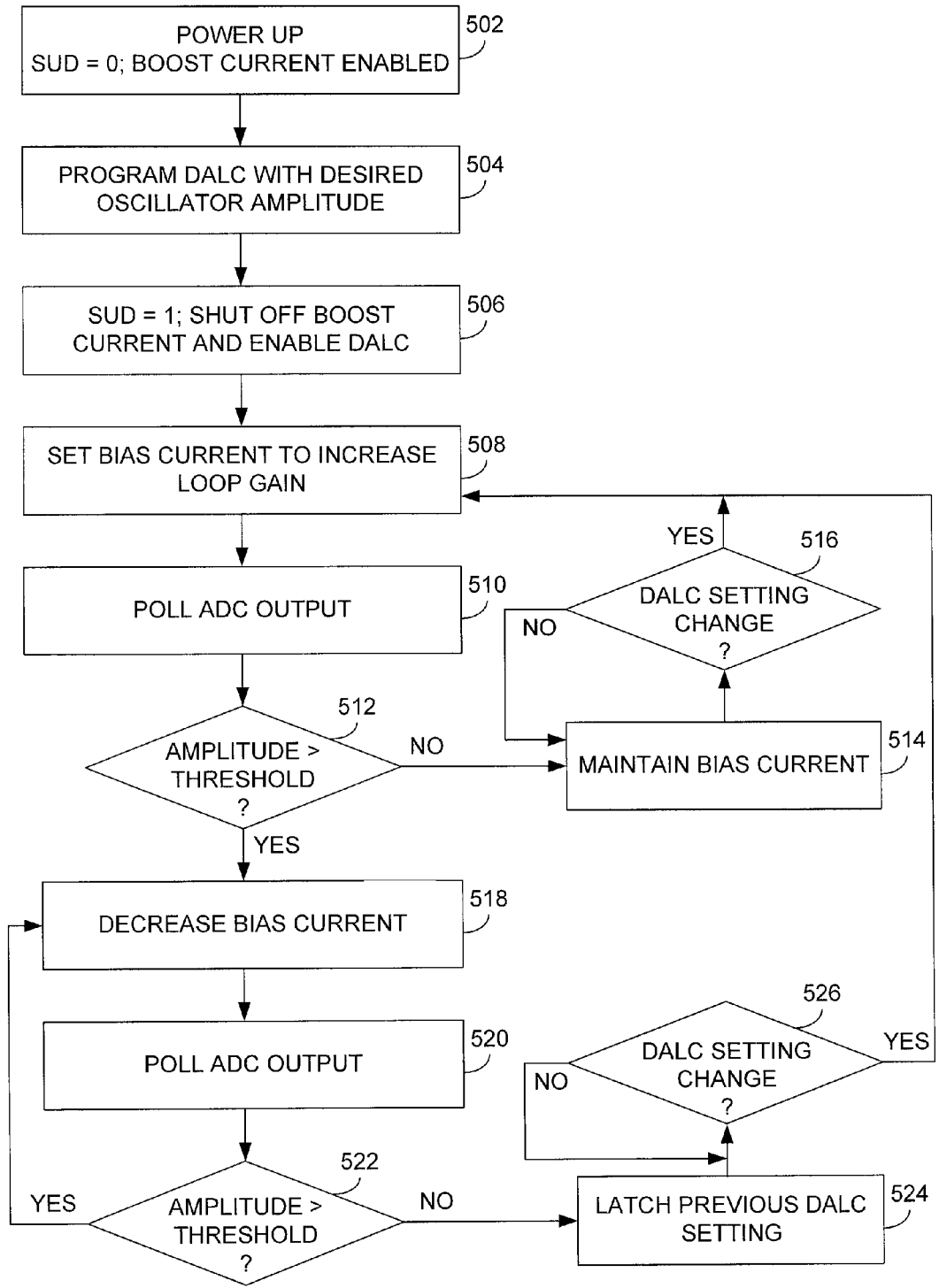
FIG. 8 is a flow chart of a digital state machine and control logic circuit for the digital automatic level control circuit, in accordance with an embodiment of the invention.

Functionality of an embodiment of digital state machine and control logic is shown in the flowchart of FIG. 8. As shown in FIG. 8, the functionality involves a power-up phase in which the start-up done bit (SUD) is set to '0' and the boost current is enabled (block 502). In block 504, the desired oscillator amplitude is programmed into the DALC, such as via a Software Programming Interface (SPI). The SUD is then set to '1' to shut off the boost current and enable the DALC (block 506). In block 508, the DALC sets the oscillator bias current to a high level, e.g. maximum, to increase loop gain. The DALC then polls the ADC output (block 510) and a determination is made as to whether the oscillator amplitude is greater than the threshold (block 512). If it is determined that the oscillator amplitude is less than the threshold, the DALC maintains the bias current (block 514). Then, such as depicted in block 516, a determination is made as to whether the DALC setting changed, such as via an SPI write. If it is determined that the DALC setting has not changed the process returns to block 514 and proceeds as described before. If, however, the DALC setting has changed, the process returns to block 508 and proceeds as described before.

Returning to block 512, it is determined that the oscillator amplitude is greater than the threshold, the DALC decreases the oscillator bias current, such as to a next lower setting (block 518). In block 520, the DALC polls the ADC output and a determination is made as to whether the oscillator amplitude is still greater than the threshold (block 522). If it is determined that the oscillator amplitude is greater than the threshold, the process returns to block 518 and proceeds as described before. If, however, it is determined that the oscillator amplitude is less than the threshold, the DALC latches the previous setting to the oscillator bias current that resulted in the oscillator amplitude being above the threshold, e.g., the oscillator amplitude above and closest to the threshold that was previously achieved (block 524). In block 526, a determination is made as to whether the DALC setting changed. If it is determined that the DALC setting has not changed the process returns to block 526 to monitor whether a change has occurred. If, however, the DALC setting has changed, the process returns to block 508 and proceeds as described before.

Figure 9:
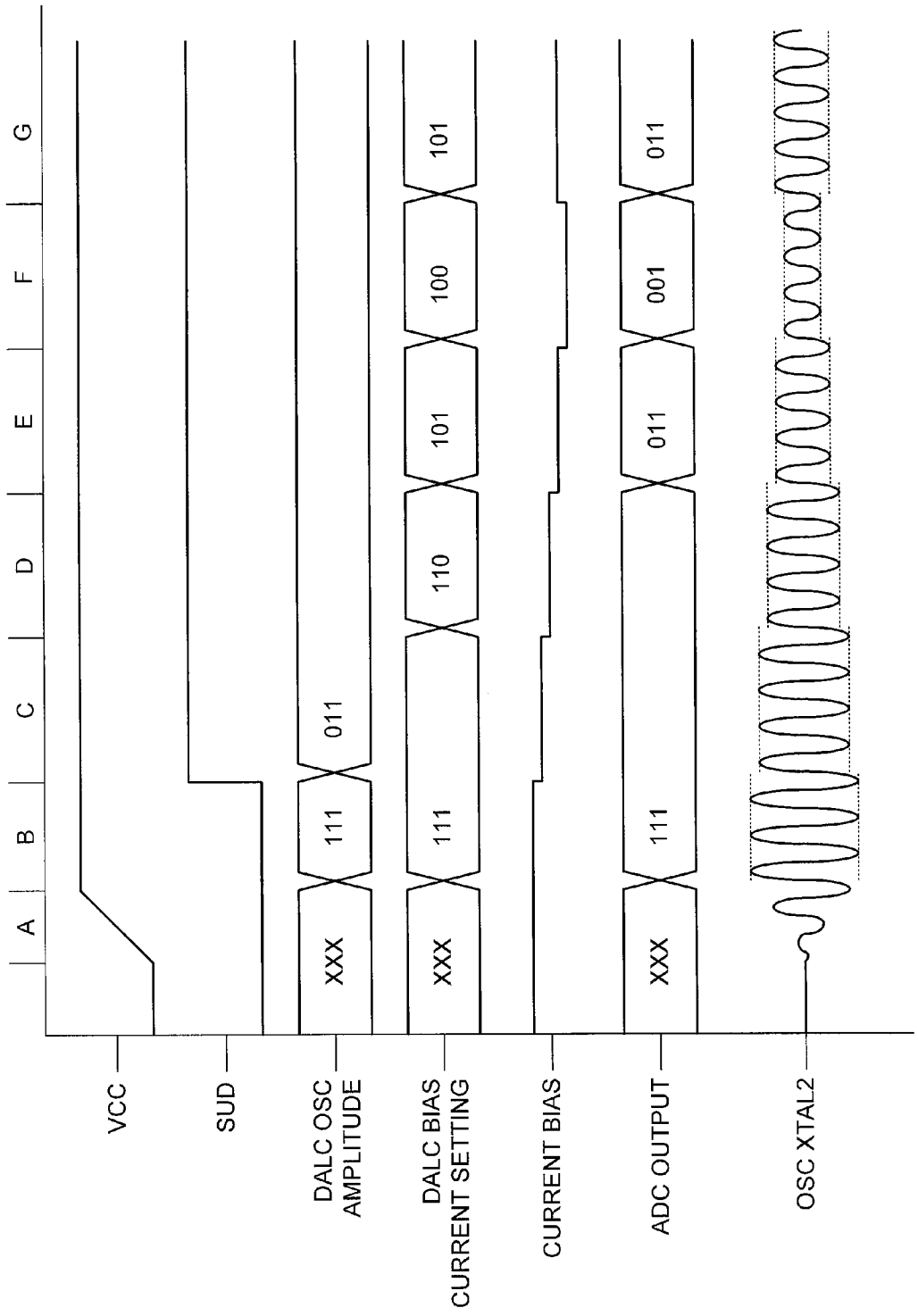
FIG. 9 is a timing diagram of the oscillator power-up sequence including DALC control signals and bias currents, in accordance with an embodiment of the invention.

An example timing diagram of a power-up sequence is shown in FIG. 9. In time period A, the power supply voltage ramps up to its final value. As the supply voltage ramps up, the startup done bit (SUD) is low. The oscillator receives the maximum bias current corresponding to the maximum loop gain and the oscillation amplitude increases. At the end of time period B, the desired DALC oscillation amplitude is programmed through the serial interface to a new value of '011'. At this time, the SUD bit is also programmed to '1' and the oscillator bias current is reduced from its startup maximum to the DALC maximum corresponding to digital bias current setting '111'. Oscillation amplitude drops, but not low enough yet for the ADC to decrement its output code. At the end of time period C, the DALC decrements its bias current setting to the next lowest value, '110', and the oscillator bias current drops proportionally. The oscillation amplitude then drops again and the ADC output also decrements by one level to '011' in time period E. Since the oscillation amplitude has not yet dropped below the desired level, the DALC again decrements the bias current to '100' at the beginning of time period F. At this time, the ADC output drops to '001' which is below the desired threshold. The DALC state machine reads this value and increments the bias current back to '101'. In time period G, the oscillator reaches its final oscillation amplitude which is just above the programmed desired level. The DALC holds this bias current setting and waits for a change in the DALC oscillator amplitude bits L2, L1, and L0, corresponding to a new programmed digital amplitude setting.

Figure 10:
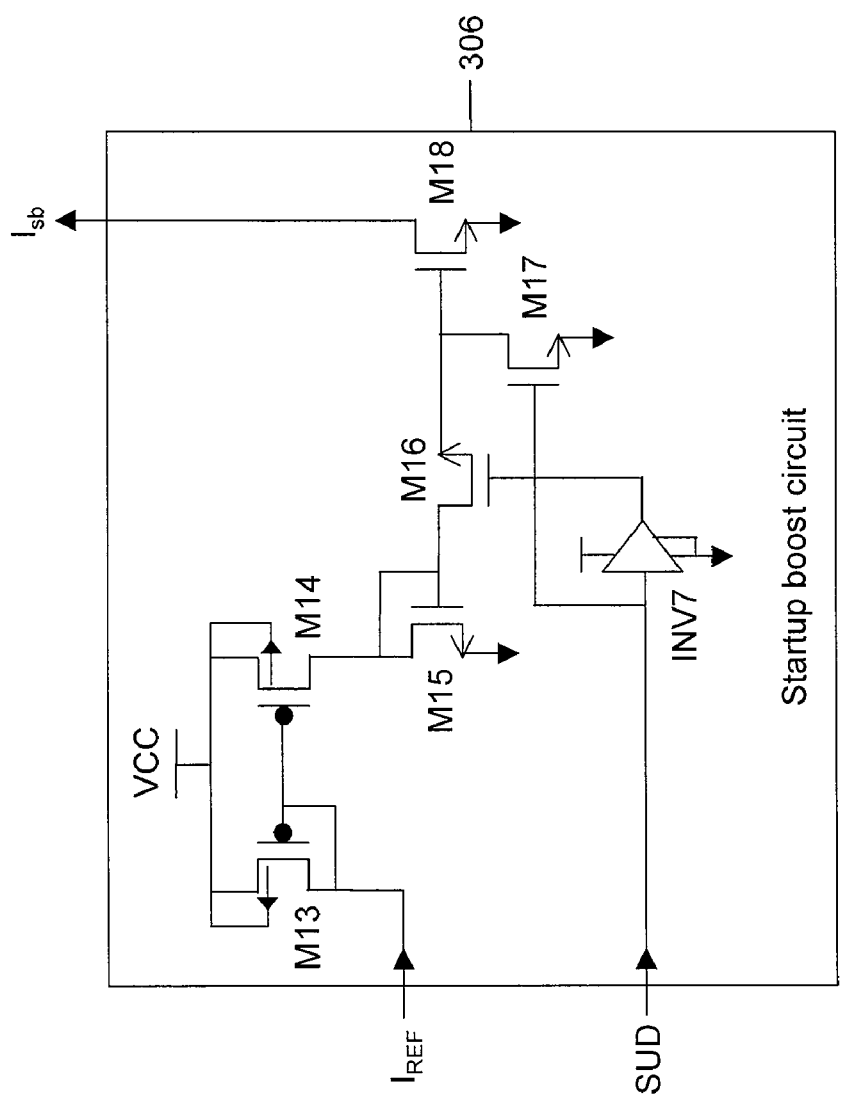
FIG. 10 is a circuit diagram of a start up boost circuit, in accordance with an embodiment of the invention.

FIG. 10 is a circuit diagram of an embodiment of a start up boost circuit that can be used in an embodiment such as that depicted in FIG. 1. In this regard, start up boost circuit 304A includes NMOSFETS M13, M14, M15, M16, M17, M18 and an inverter INV7. Start up boost circuit 304 compensates for the drive-level dependencies of a crystal (e.g. crystal 104) by providing start up boost current $I_{sb}$ to differential amplifier (e.g. differential amplifier 102).

Start up boost circuit 304A receives reference voltage $I_{REF}$ as input from low-noise current bias 308. Start up boost circuit 304 also receives a value of a Start up Done (SUD) bit as input, which controls the start up boost current $I_{sb}$. The value of the SUD bit is programmed through the Software Programming Interface (SPI) from a demodulator (not shown in the figure). Initially, the value of the SUD bit is equal to zero, indicating that start up has not been completed. Hence, start up boost current $I_{sb}$ is activated. After a certain start up time, the amplitude of reference signals provided by an associated oscillator circuit reaches sufficient amplitude, to provide an external reference to the demodulator. The demodulator then programs the value of the SUD bit to be one, as part of the normal power-up sequence. The value of the SUD bit being equal to one, indicates that start up has been completed, and therefore start up boost current $I_{sb}$ is deactivated.

NMOSFETS M13, M14, M15 and M16 act as current mirrors to mirror and scale reference current $I_{REF}$ to the required amplitude level of start up boost current $I_{sb}$. The required start up boost current $I_{sb}$ is provided at the drain terminal of NMOSFET M18.

NMOSFETS M16 and M17 act as switches to activate or deactivate start up boost current $I_{sb}$. When the value of the SUD bit is equal to zero, inverter INV1 outputs one and NMOSFET M16 is activated. Start up boost current $I_{sb}$ is mirrored from M15 to M18 with a sufficient scale factor to produce start up boost current $I_{sb}$. When the value of the SUD bit is equal to one, inverter INV1 outputs zero and NMOSFET M16 is deactivated. Start up boost current $I_{sb}$ does not pass through NMOSFET M16, and hence, there is no start up boost current $I_{sb}$. Therefore, start up boost current $I_{sb}$ provides maximum open-loop gain at start up to power-up the crystal in oscillator circuit.

The combination of an oscillator, DALC and start up boost circuit provides reference signals with improved characteristics in comparison with prior art oscillator circuits. The improved characteristics of the reference signals are illustrated in reference to prior art oscillator circuits, in conjunction with FIGS. 11-16b.

Figure 11:
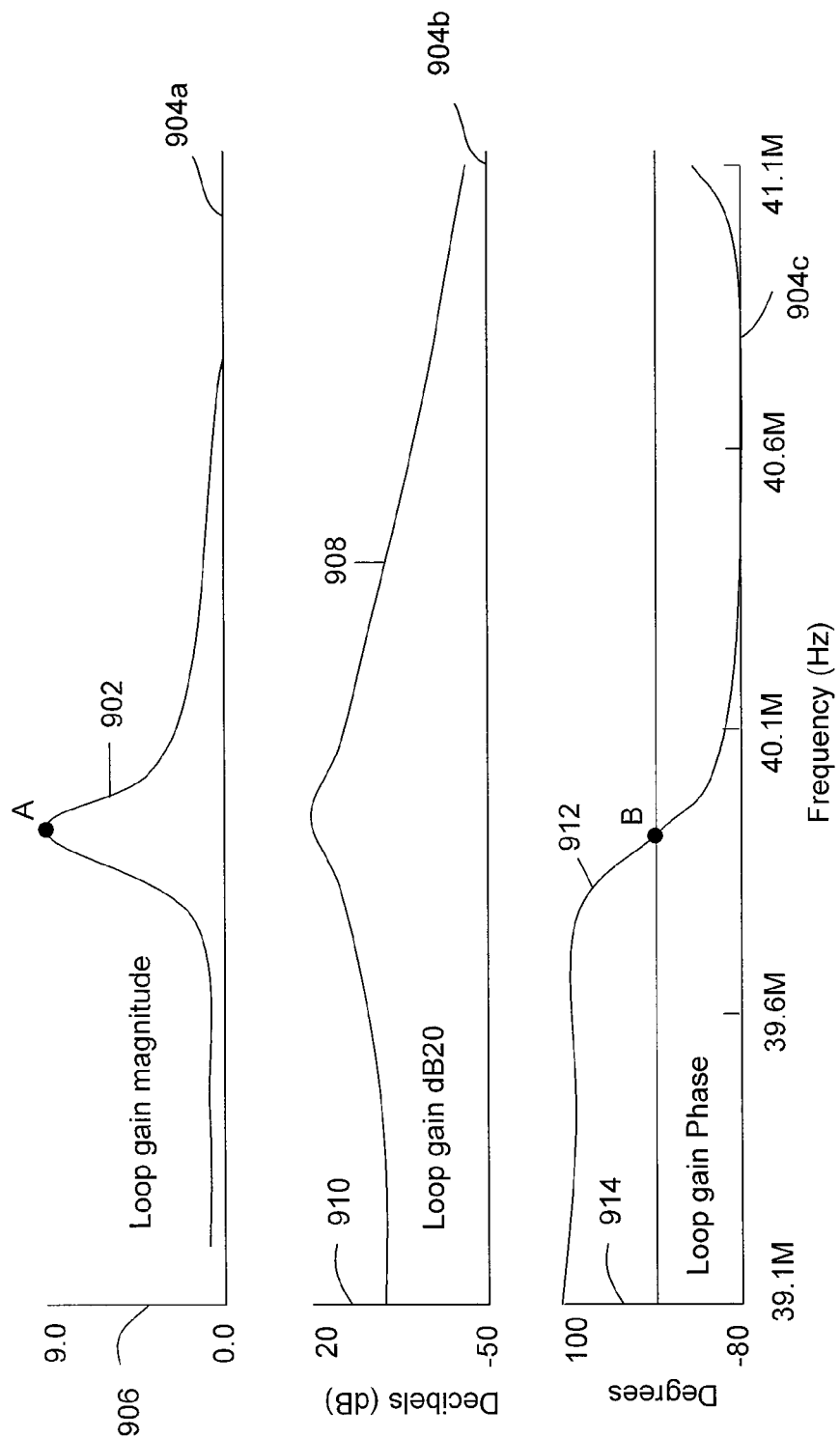
FIG. 11 is a diagram illustrating graphs for loop gain in prior art oscillator circuits.

FIG. 11 is a diagram illustrating graphs for loop gain in prior art oscillator circuits. In particular, FIG. 11 includes three graphs for illustrating loop-gain magnitude, loop gain magnitude in decibels (dB20), and the loop-gain phase. Note that the peak open loop gain when the phase crosses zero is much higher than one, which is the minimum required for oscillation.

Graph 902 depicts the open loop-gain magnitude in a representative prior art oscillator circuit. The values along X-axis 904a depict the frequency in Hertz (Hz,), ranging from 39.1 MHz to 41.1 MHz. The values along Y-axis 906 depict the magnitude of the open loop gain, ranging from 0.0 to 9.0 units. Point A is the available open loop gain for startup at a magnitude of 9.0.

Graph 908 depicts the loop gain dB20 in a representative prior art oscillator circuit. Graph 908 depicts the loop gain magnitude of graph 902, converted into decibels. The values along X-axis 904b depict the frequency in Hertz (Hz), ranging from 39.1 MHz to 41.1 MHz. The values along Y-axis 910 depict the loop gain in decibels (dB) ranging from −50 dB to 20 dB.

Graph 912 depicts the loop gain phase in a representative prior art oscillator circuit. The values along X-axis 904c depict the frequency in Hertz (Hz), ranging from 39.1 MHz to 41.1 MHz. The values along Y-axis 914 depict the loop-gain phase in degrees ranging from −80 degrees to 100 degrees. Point B is the point at which the loop-gain phase crosses zero degrees at approximately 40 MHz.

Figure 12:
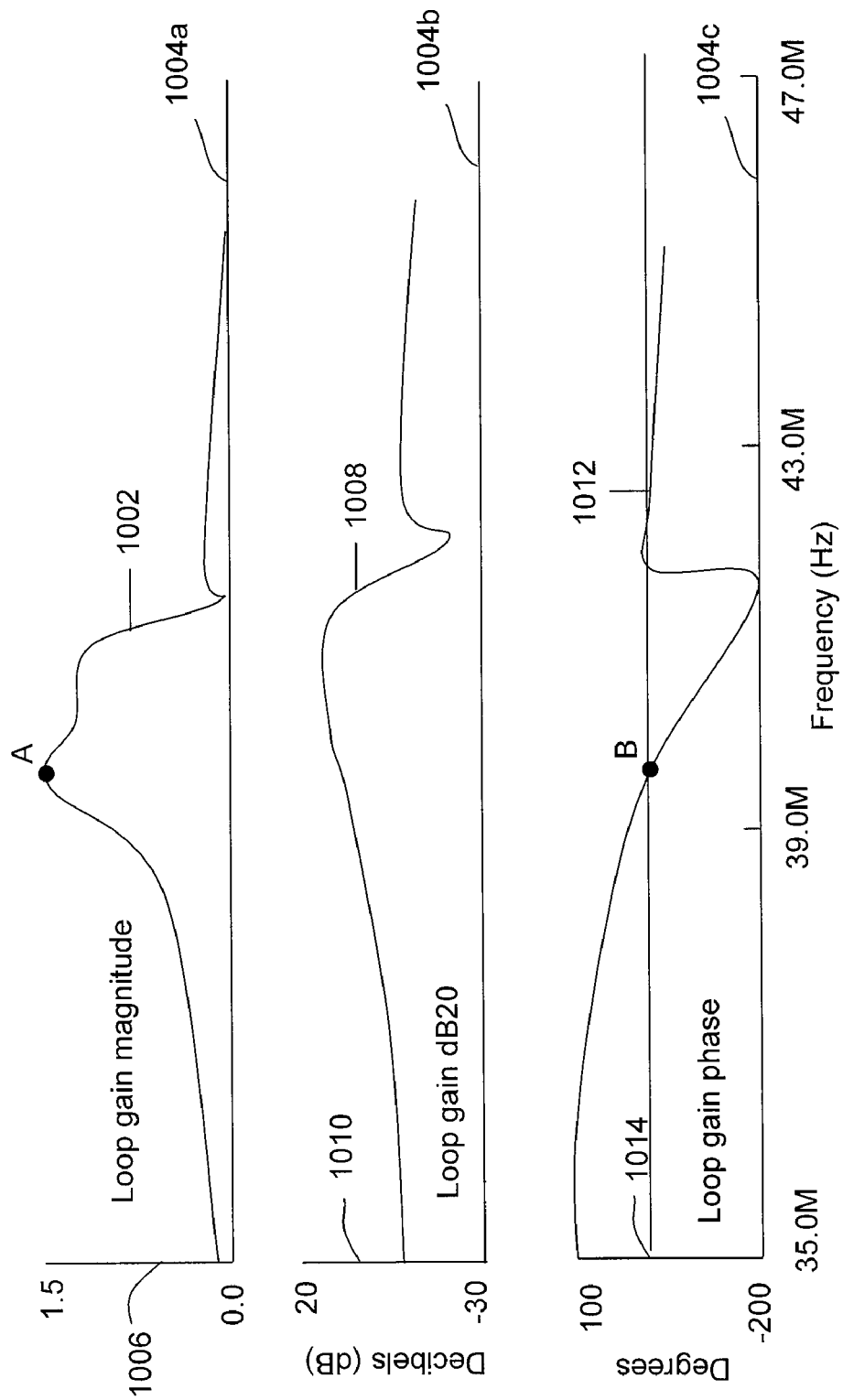
FIG. 12 is a diagram illustrating graphs for loop gain in an embodiment of an oscillator circuit.

FIG. 12 is a diagram illustrating graphs for loop gain in the representative embodiment of the oscillator circuit 100 of FIG. 4. Specifically, FIG. 2 includes three graphs for illustrating loop-gain magnitude, loop gain dB20 and the loop-gain phase.

Graph 1002 depicts the loop-gain magnitude in the representative oscillator circuit 100. The values along X-axis 1004a depict the frequency in Hertz (Hz), ranging from 35.0

MHz to 47.0 MHz. The values along Y-axis 1006 depict the magnitude of the open loop gain, ranging from 0.0 units to 1.5 units. Point A is the magnitude of loop gain at zero degrees phase shift defining the oscillation condition. The magnitude of open loop gain at the oscillation point in oscillator circuit 100, is much lower compared to the prior art oscillator circuit.

Graph 1008 depicts the loop gain dB20 in the representative oscillator circuit 100. Graph 1008 depicts the loop-gain magnitude of graph 1002 converted into decibels. The values along X-axis 1004b depict the frequency in Hertz (Hz), ranging from 35.0 MHz to 47.0 MHz. The values along Y-axis 1010 depict the loop gain in decibels (dB), ranging from −30 dB to 20 dB.

Graph 1012 depicts the loop-gain phase in oscillator circuit 100. The values along X-axis 1004c depict the frequency in Hertz (Hz), ranging from 35.0 MHz to 47.0 MHz. The values along Y-axis 1014 depict the loop-gain phase in degrees ranging from −200 degrees to 100 degrees. Point B is the point at which the loop-gain phase crosses zero degrees at approximately 40 MHz.

Figure 13:
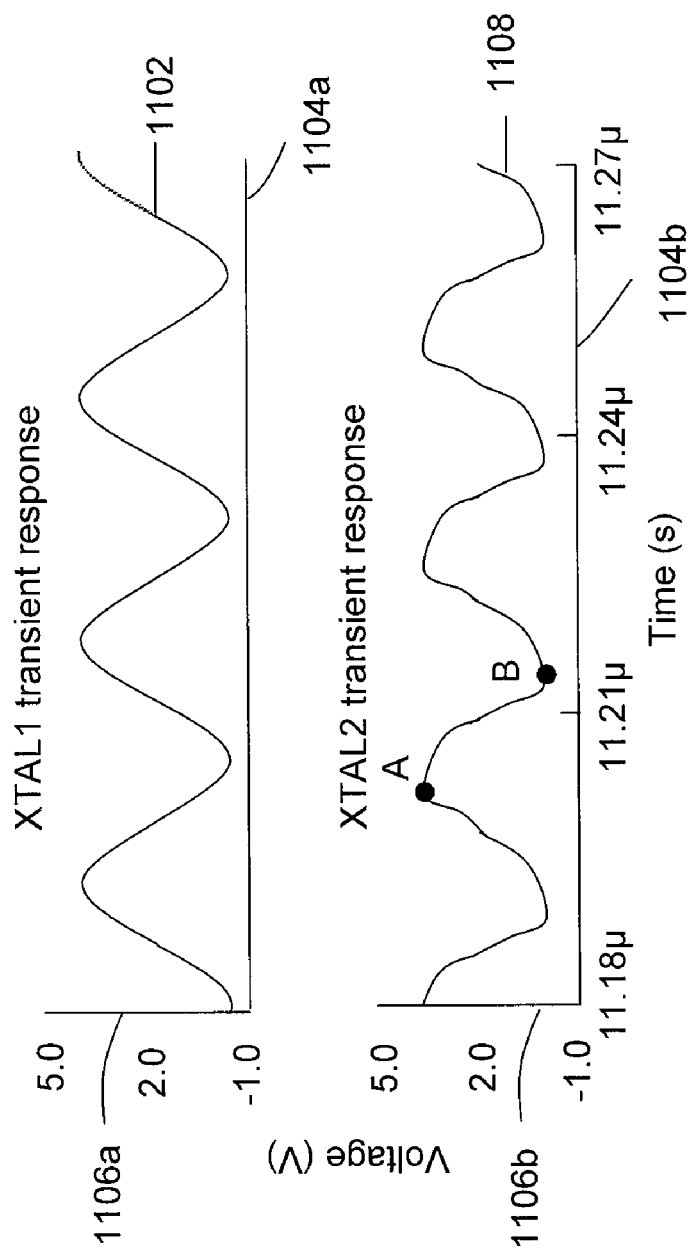
FIG. 13 is a diagram illustrating graphs for the transient response of the crystal in prior art oscillator circuits.

FIG. 13 is a diagram illustrating graphs for the transient response of the crystal in prior art oscillator circuit. Specifically, FIG. 13 includes two graphs for illustrating the transient response at the crystal input (XTAL1) and the crystal output (XTAL2).

Graph 1102 depicts the transient response of XTAL1 in a prior art oscillator circuit. The values along X-axis 1104a depict the time in seconds (s), ranging from 11.18 μs to 11.27 μs. The values along Y-axis 1106a depict the voltage in volts (V), ranging from −1.0 V to 5.0 V.

Graph 1108 depicts the transient response of XTAL2 in a prior art oscillator circuit. The values along X-axis 1104b depict the time in seconds (s), ranging from 11.18 μs to 11.27 μs. The values along Y-axis 1106b depict the voltage in volts (V), ranging from −1.0 V to 5.0 V. Points A and B depict the peak-to-peak amplitude of the waveform, which is approximately 3 V. Graph 1108 is not a pure sinusoid but has harmonic non-linear content. Graphs 1102 and 1108 are also out of phase with one another since the waveforms have a phase difference at 11.18 μs.

Figure 14:
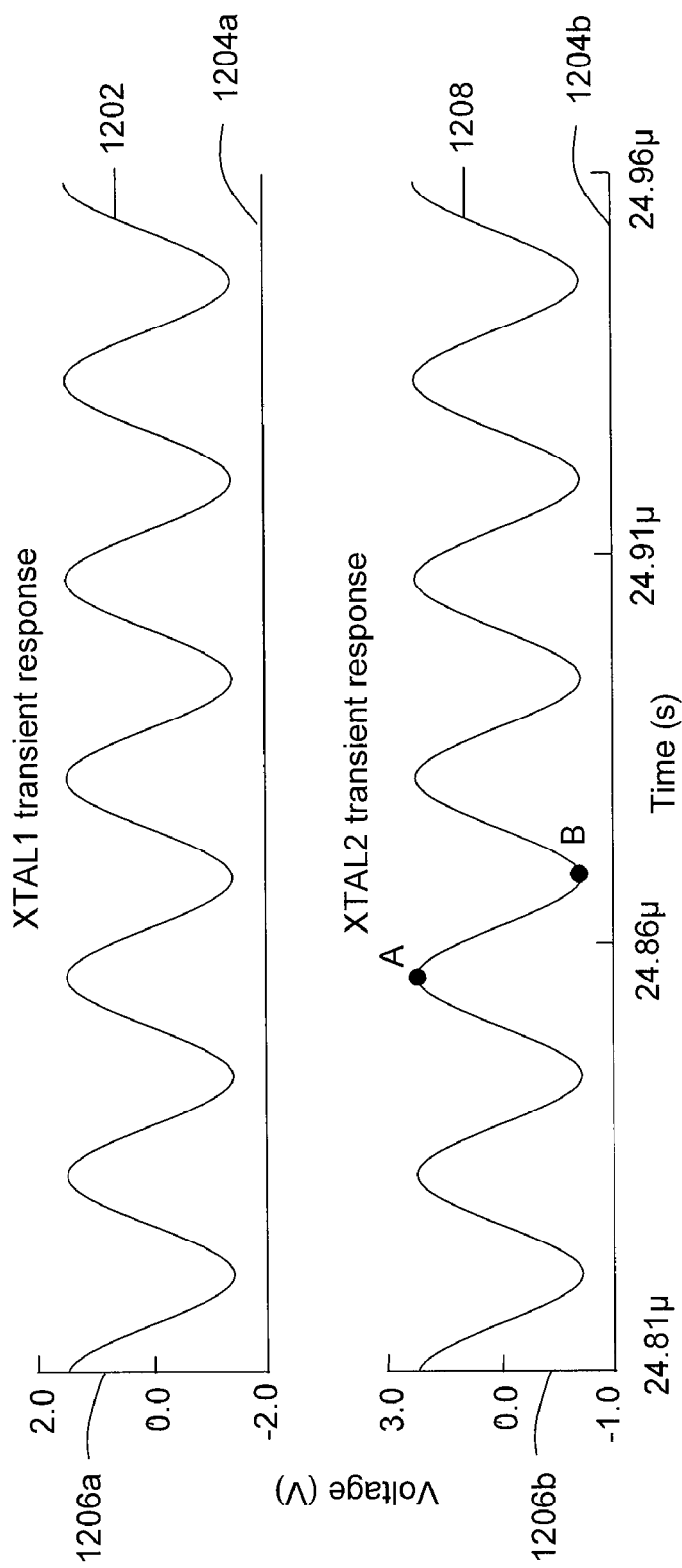
FIG. 14 is a diagram illustrating graphs for the transient response of the crystal in an embodiment of an the oscillator circuit.

FIG. 14 is a diagram illustrating graphs for the transient response of crystal 104 in the representative oscillator circuit 100. Specifically, FIG. 4 includes two graphs for illustrating the transient response at the input of crystal 104 (XTAL1) and the output of crystal 104 (XTAL2).

Graph 1202 depicts the transient response of XTAL1 in oscillator circuit 100. The values along X-axis 1204a depict the time in seconds (s), ranging from 24.81 μs to 24.96 μs. The values along Y-axis 1206a depict the voltage in volts (V), ranging from −2.0 V to 2.0 V.

Graph 1208 depicts the transient response of XTAL2 in oscillator circuit 100. The values along X-axis 1204b depict the time in seconds (s), ranging from 24.81 μs to 24.96 μs. The values along Y-axis 1206b depict the voltage in volts (V), ranging from −1.0 V to 3.0 V. Points A and B depict the peak-to-peak amplitude of the waveform, which is approximately 2V. Graph 1208 is a pure sinusoid with no harmonic non-linear content. Graphs 1202 and 1208 are also in phase with one another, since the waveforms do not have a phase difference at 24.81 μs. Therefore, the transient response of XTAL2 in oscillator circuit 100 improves, resulting in lower reference spurs in the reference signals produced by oscillator circuit 100, as compared to a prior art oscillator circuit.

Figure 15A:
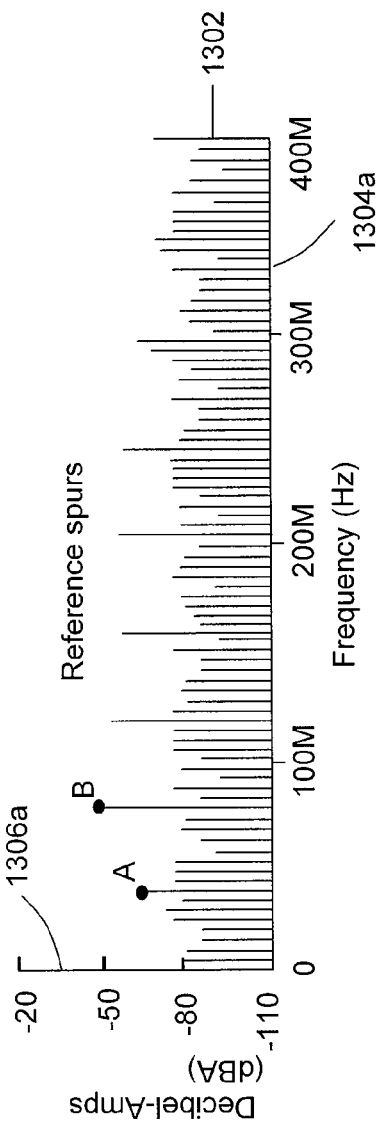
FIGS. 15A and 15B are diagrams illustrating graphs for reference spurs in prior art oscillator circuits and in an embodiment of an oscillator circuit.
Figure 15B:
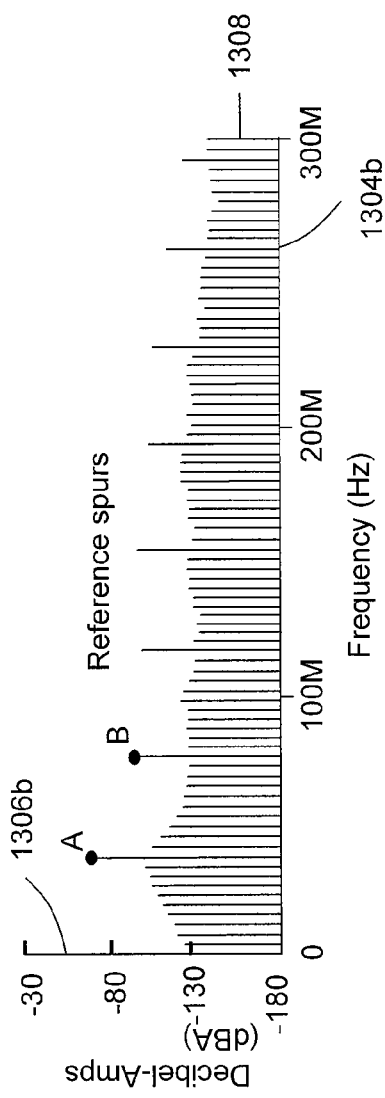

FIGS. 15A and 15B are diagrams illustrating graphs for reference spurs in a prior art oscillator circuit and the representative oscillator circuit 100, respectively. Graph 1302 depicts the reference spurs in the reference signals provided by the prior art oscillator circuit. The values along X-axis 1304a depict the frequency in hertz (Hz) ranging from zero to 400 MHz. The values along Y-axis 1306a depict the spectrum of supply switching currents in decibel amperes (dBA) ranging from −110 dBA to −20 dBA. Point A depicts the reference spur at the $3^{rd}$ overtone resonant frequency of the crystal, which is 40 MHz. Point B depicts the reference spur at the $2^{nd}$ harmonic of the third overtone frequency of the crystal, which is 80 MHz. The reference spurs in graph 1302 are irregular and have high spurious content.

Graph 1308 depicts the reference spurs in the reference signals provided by oscillator circuit 100. The values along X-axis 1304b depict the frequency in hertz (Hz) ranging from zero to 300 MHz. The values along Y-axis 1306b depict the spectrum of supply switching currents ranging from −180 dBA to −30 dBA. Point A depicts the reference spur at the $3^{rd}$ overtone resonant frequency of crystal 104, which is 40 MHz. Point B depicts the reference spur at the $2^{nd}$ harmonic of the third overtone frequency of crystal 104, which is 80 MHz. The reference spurs in graph 1302 decrease at higher frequencies and have significantly lower spurious content. Therefore, oscillator circuit 100 reduces the reference spurs in the reference signals, as compared to the prior art oscillator circuit.

FIGS. 16A and 16B are diagrams illustrating graphs for switching current in a prior art oscillator circuit and oscillator circuit 100 respectively. Graph 1402 depicts the switching current in the prior art oscillator circuit. The values along X-axis 1404a depict the time in seconds (s) ranging from 14.25 μs to 14.34 μs. The values along Y-axis 1406a depict the current in amperes (A) ranging from −20 mA to 10 mA. Graph 1402 is not a sinusoid and has high harmonic non-linear content. The high harmonic non-linear content of the switching current in prior art oscillator circuits results in increased reference spurs, as illustrated in FIG. 15A.

Graph 1408 depicts the switching current in oscillator circuit 100. The values along X-axis 1404b depict the time in seconds (s) ranging from 27.11 μs to 27.23 μs. The values along Y-axis 1406b depict the current in amperes (A) ranging from −4.7 mA to −3.2 mA. Graph 1408 is a pure sinusoid and has negligible harmonic non-linear content. The negligible harmonic non-linear content of the switching current in oscillator circuit 100 results in reduced reference spurs, as illustrated in FIG. 15B.

Figure 17:
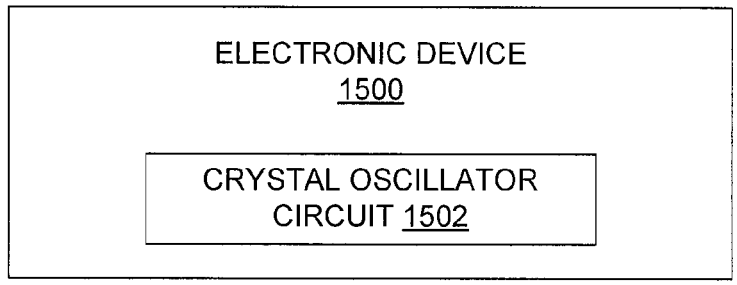
FIG. 17 is a schematic diagram depicting an embodiment of an electronic device that implements an embodiment of a crystal oscillator circuit.

In this regard, FIG. 17 is a schematic diagram depicting an embodiment of an electronic device that implements such a crystal oscillator circuit. In particular, system 1500, which can be configured as various types of devices (e.g., set-top boxes, televisions, computing devices, such as portable appliances and gaming units satellite systems, entertainment devices, MP3 players, ipod® players, cell phones, wireless communication receivers and communication devices), incorporates an embodiment of a crystal oscillator circuit 1502. Specifically, circuit 1502 is provisioned with one or more features, e.g., those features described with respect to the previous representative embodiments. As such, the circuit facilitates functionality demonstrated by the electronic device 1500.

Figure 18:
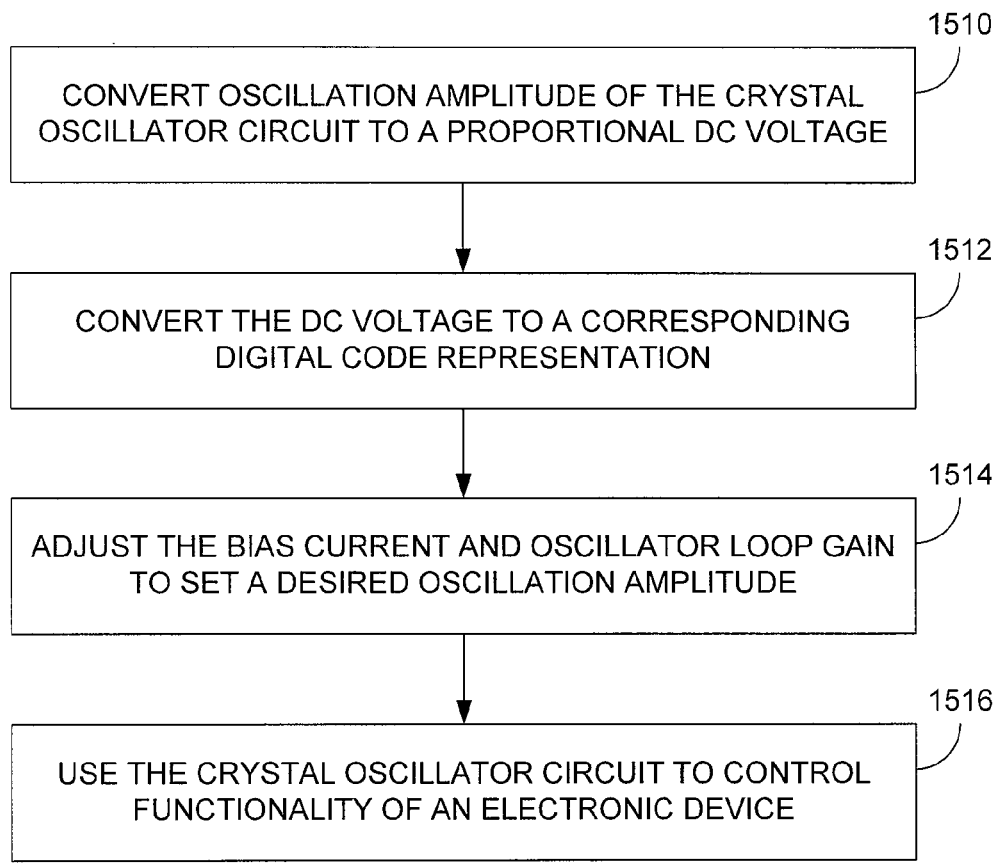
FIG. 18 is a flowchart depicting functionality of an embodiment, such as that show in FIG. 17.

Operation of an electronic device, such as that depicted in FIG. 17 is depicted in the flowchart of FIG. 18. As shown in FIG. 18, the functionality may be construed as beginning at block 1510, in which an oscillation amplitude of the crystal oscillator circuit is converted to a proportional DC voltage. In block 1512, the DC voltage is converted to a corresponding digital code representation and in block 1514, the bias current and the oscillator loop gain are adjusted such that a desired oscillation amplitude is set. Then, as depicted in block 1516, the crystal oscillator circuit is used to control functionality of an electronic device.

As described above with respect to several exemplary embodiments, an oscillator circuit can reduces the harmonic non-linear content of switching currents, thereby reducing the reference spurs on a broadband chip set. A digital automatic-level control can enable a constant swing in the signal output provided by the crystal, without degrading the phase noise of the oscillator circuit. A start-up boost circuit provided can guarantee crystal oscillator start up over a wide range of crystals under worst-case PVT conditions without excessive loop gain.

It should be noted that a wide range of products, including sensitive analog circuits such as silicon tuners and demodulators, can incorporate at least one of the aforementioned features. For example, many different silicon-process technologies and feature sizes, including Bipolar, BiCMOS, and CMOS can be used to implement such. While preferred embodiments of the invention have been illustrated and described, it will be clear that the invention is not limited to these embodiments only. Numerous modifications, changes, variations, substitutions and equivalents will be apparent to those skilled in the art, without departing from the spirit and scope of the invention, as described in the claims.

What is claimed is:

1. A system comprising:
   a crystal oscillator circuit; and
   a digital automatic level control circuit operative to: convert an oscillation amplitude of the crystal oscillator circuit from a differential output signal to a proportional DC voltage; convert the DC voltage to a corresponding digital code representation; and adjust bias current and oscillator loop gain such that a desired oscillation amplitude is set, and
   wherein the crystal oscillator circuit comprises a differential crystal oscillator that includes
      first and second NMOSFET transistors with a programmable tail current source electrically connected as a differential pair;
      an RLC tank electrically connected as a load;
      a crystal electrically connected in series mode and operative as a filter with high quality factor; and
      a capacitance transformer operative to block DC bias from the crystal and to couple the RLC tank to the crystal.

2. The system of claim 1, wherein the series mode crystal is a fundamental crystal.

3. The system of claim 1, wherein the series mode crystal is an overtone crystal.

4. The system of claim 1, wherein:
   the system comprises a broadband chip set;
   the crystal oscillator circuit and the digital automatic level control circuit form a portion of the broadband chip set; and
   the RLC tank is an off-chip RLC tank.

5. A system comprising:
   a crystal oscillator circuit comprising:
      means for limiting an oscillation amplitude of the circuit to a programmable level; and
      means for providing increased gain at startup such that drive level dependency variation in a crystal of the circuit is compensated;
      means for digital automatic level control comprising:
         means for converting the oscillation amplitude of the crystal oscillator circuit from a differential output signal to a proportional DC voltage.

6. The system of claim 5, further comprising means for providing differential output signals with reduced reference spurs.

7. The system of claim 5, wherein the means for digital automatic level control comprises:
   means for converting the proportional DC voltage to a corresponding digital code representation; and
   means for adjusting a bias current and an oscillator loop gain such that a desired oscillation amplitude is set.

8. The system of claim 7, wherein the means for digital automatic level control further comprises means for rectifying the oscillation amplitude into the proportional DC voltage.

9. The system of claim 7, wherein the means for digital automatic level control further comprises means for converting the proportional DC voltage into the corresponding digital code representation.

10. The system of claim 7, wherein the means for digital automatic level control further comprises a means for selecting the bias current and the oscillator loop gain corresponding to the desired oscillation amplitude.

11. The system of claim 7, further comprising a means for increasing gain at startup such that drive level dependency variation in a crystal of the crystal oscillator circuit is compensated.

12. The system of claim 7, further comprising a means for filtering signals of a crystal of a differential crystal oscillator circuit with an RLC tank electrically connected as a load.

13. A method for reducing reference spurs in an output of a crystal oscillator circuit, the method comprising:
   converting an oscillation amplitude of the crystal oscillator circuit from a differential output signal to a proportional DC voltage;
   converting the proportional DC voltage to a corresponding digital code representation;
   adjusting bias current and oscillator loop gain such that a desired oscillation amplitude is set; and
   filtering signals of a crystal of a differential crystal oscillator circuit with an RLC tank electrically connected as a load.

* * * * *